United States Patent
Levy

(10) Patent No.: US 6,810,506 B1
(45) Date of Patent: Oct. 26, 2004

(54) METHODOLOGY FOR STITCHING REDUCED-ORDER MODELS OF INTERCONNECTS TOGETHER

(75) Inventor: Harold J. Levy, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 187 days.

(21) Appl. No.: 10/152,408

(22) Filed: May 20, 2002

(51) Int. Cl.[7] .............................................. G06F 17/50
(52) U.S. Cl. ............................................... 716/2; 716/1
(58) Field of Search .................................... 716/1, 2, 3

(56) References Cited

U.S. PATENT DOCUMENTS

| | | | |
|---|---|---|---|
| 5,930,499 A | * | 7/1999 | Chen et al. ..................... 716/8 |
| 6,041,168 A | * | 3/2000 | Hasegawa ....................... 716/6 |

OTHER PUBLICATIONS

Jaimoukha, I.M., et al., "Numerical solution of large scale Lyapunov equations using Krylov subspace models", 1992, IEEE, pp. 1927–1932.*

Levy, H., et al., "A rank–one update method for efficient processing of interconnect parasitics in timing analysis", 2000, IEEE, pp. 75–78.*

Antoulas, Athanasios C., et al., "Approxiamtion of large–scale dynamical systems: an overview", 2001, Int J. Applied Mathematical Comput. Sci., vol. 11, No. 5, pp. 1093–1121.*

Jing, Rebecca Li et al., "Efficient model reduction of interconnect via approximate system gramians", 1999, IEEE. pp. 380–383.*

Ying, Liu, et al., "Model order reduction of RC(L) interconnect including variational analysis", 1999, ACM. pp. 1–6..*

Datta, Biswa Nath et al., "Generalized arnoldi mehtods for the sylvester–observer equation and the multi–input pole placement problem", 1997, IEEE. pp. 4379–4383.*

Sorensen, D.C., "Implicity restarted arnholdi/lanczos mehtods for large scale eigenvalue calculations", Oct. 1995, Depeartment of Computational and Applied Mathematics, Rice University. pp. 1–36.*

* cited by examiner

Primary Examiner—Stacy A. Whitmore
(74) Attorney, Agent, or Firm—Bever, Hoffman & Harms, LLP; Jeanette S. Harms

(57) ABSTRACT

A computer implemented method of producing a reduced order model of an electronic circuit to model the connection of two or more circuits. Arnoldi reduced order models for nodes of circuits to be interconnected may be computed. A set of modified nodal analysis matrices for the combination of the two circuits may be constructed. A rank one update may be applied to the modified set of nodal analysis matrices to produce a reduced order model of the combined electronic circuits. In this novel manner, a reduced order model for a combination of circuits may be produced from the individual reduced order models of the individual circuits without the need to recompute the reduced order models of the original circuits, and without the need of the original parasitic network models. The resulting reduced order model may be used in a variety ways consistent with well known uses of such matrices within the field of electronic design automation.

21 Claims, 5 Drawing Sheets

$$G = \begin{bmatrix} \frac{1}{r_d} + \frac{1}{r_{12}} & -\frac{1}{r_{12}} & 0 \\ -\frac{1}{r_{12}} & \frac{1}{r_{12}} + \frac{1}{r_{23}} & -\frac{1}{r_{23}} \\ 0 & -\frac{1}{r_{23}} & \frac{1}{r_{23}} \end{bmatrix} \overset{20}{\longleftarrow} \quad C = \begin{bmatrix} c_1 & 0 & 0 \\ 0 & c_2 & 0 \\ 0 & 0 & c_3 \end{bmatrix} \overset{30}{\longleftarrow}$$

$$gnew = \begin{matrix} g1 & u12 \\ u12' & g2 \end{matrix} \quad \sim 220$$

$$cnew = \begin{matrix} c1 & 0 \\ 0 & c2 \end{matrix} \quad \sim 230$$

$$unew = \begin{matrix} u1 & 0 \\ 0 & u2 \end{matrix} \quad \sim 240$$

Figure 4

$$U_c = \begin{bmatrix} U_{1i} \\ U_{2j} \end{bmatrix} \quad \leftarrow 510$$

$$X = \begin{bmatrix} G_1 & 0 \\ 0 & G_2 \end{bmatrix} \quad \leftarrow 520$$

$$G_{12} = X + \Delta G \, U_c \quad \leftarrow 530$$

$$G_{12} = \begin{bmatrix} G_1 & U_c \\ U_c^T & G_2 \end{bmatrix} \quad \leftarrow 540$$

$$C_{12} = \begin{bmatrix} C_1 & 0 \\ 0 & C_2 \end{bmatrix} \quad \leftarrow 550$$

$$U_{12} = \begin{bmatrix} U_1 & 0 \\ 0 & U_2 \end{bmatrix} \quad \leftarrow 560$$

Figure 5

METHODOLOGY FOR STITCHING REDUCED-ORDER MODELS OF INTERCONNECTS TOGETHER

FIELD OF THE INVENTION

Embodiments of the present invention relate to the simulation of integrated circuits. More particularly, embodiments of the present invention provide a methodology for stitching reduced-order models of interconnects together.

BACKGROUND ART

Modern large semiconductor devices typically make use of a "bottom up" design philosophy. With such a design approach, individual functional blocks, or "IP blocks" (Intellectual Property blocks) may be designed first, or sometimes independently of the overall chip design. Frequently, such blocks are designed for reuse in many chip designs and may even be bought and sold among chip design companies. Typically, certain IP blocks are designed for fundamental and commonly used purposes.

By combining and interconnecting several IP blocks, along with typically some new design effort, very large integrated circuits, comprising hundreds of thousands of gates, may be rapidly designed. The combination of many blocks, sometimes known as "hierarchies," is also called a hierarchical design.

When designing integrated circuits, designers typically analyze the design at several stages prior to production. It can cost tens of thousands of dollars to produce a single batch of integrated circuits. Further, the production tools that control the manufacture of a specific integrated circuit, e.g., a set of masks that define the physical outline of the semiconductor regions, can cost a quarter of a million dollars. There is great incentive to analyze and understand the behavior of the integrated circuit prior to expending such sums.

Within each IP block, there will typically be wires interconnecting elements of the IP block. Further, there will generally be wires interconnecting the various IP blocks to one another and to additional circuitry. Importantly, there may also be parasitic behaviors associated with such wires. Such parasitic effects are generally undesirable behaviors due to characteristics of the semiconductor elements or the semiconductor manufacturing process. For example, a wire does not have exactly zero resistance. There is typically some resistance, and perhaps non-negligible inductance and capacitance (reactance) in the wire. Such parasitic effects are typically modeled by small lumped resistors and/or capacitors distributed throughout the circuit in a manner similar to transmission line analysis techniques.

In order to analyze the timing of the integrated circuit design, all such parasitic effects should be considered. For example, a wiring interconnect or "net" running between two IP blocks will typically have a portion in a first IP block, a portion in a second IP block and a portion in between the two blocks. Such a net may have many nodes; each node representing a unique point in the circuit, and each such node being modeled as a combination of resistors, capacitors and/or inductors. All such portions will typically have parasitic effects, and the contributions of all parasitic effects from all portions should be considered in the timing analysis.

Unfortunately, as the number of gates, and hence the number of parasitic devices in the model grow, complete simulation and timing analysis becomes unwieldy. Consequently, timing analysis with a full set of parasitic elements in the model is usually not performed. Likewise, for similar computational reasons, synthesis (a computer implemented software process for translating a design specified in a high level language into fundamental design elements) with delay simulations is generally only performed with highly approximate wire models based on statistics, not the detailed wire models for the actual network parasitics.

Approximations to the parasitics for each hierarchical network segment can be made, but such approximations must be compatible with hierarchical composition. For example, consider approximating each network segment by its Elmore delay (first moment). When these delays are added to effect the hierarchical composition, the result can be grossly incorrect. For example, two simple RC networks with respective Elmore delays $R1*C1$ and $R2*C2$, wiring them in series would yield an Elmore delay of $R1*C1+(R2+R2)*C2$, and not the sum of the individual Elmore delays $R1*C1+R2*C2$.

In the prior art, this problem has been somewhat mitigated by using a Reduced Order Model, ROM, at each stage of a design. Typically, a ROM may be generated for each IP block, and used as a model for the parasitic effects of that IP block. This may greatly reduce the number of devices actually modeled, and may allow for accurate timing analysis, and even simultaneous synthesis and delay simulation.

A reduced order model is typically generated by an analysis tool, such as PrimeTime, commercially available from SYNOPSYS of Mountain View, Calif. A drawback to the efficacy of such reduced order models is that a single change to the IP block generally necessitates the entire ROM to be recomputed. Such changes, for example a change in the placement and/or routing of a circuit, are common in the iterative design process. Unfortunately, in the prior art, such a change generally required repeating the entire reduction process.

SUMMARY OF THE INVENTION

Therefore, it would be advantageous to provide a computer controlled methodology for combining reduced-order models of interconnected circuits together without the need to recompute the reduced order model of each circuit. A further need exists for a method of storing necessary information for combining circuits with a circuit's reduced order model. A still further need exists for a method of combining reduced order models that produces a reduced order model that is compatible with existing uses of reduced order models.

Embodiments of the present invention provide an advantageous methodology for combining reduced-order models of interconnected circuits together without the need to recompute the reduced order model of each circuit. Additional embodiments provide a method of storing necessary information for combining circuits with a circuit's reduced order model. Further embodiments of the present invention provide a method of combining reduced order models that produces a reduced order model that is compatible with existing uses of reduced order models.

More specifically, a computer implemented method of producing a reduced order model of an electronic circuit to model the connection of two or more circuits is disclosed. Arnoldi reduced order models for nodes of circuits to be interconnected may be computed. A set of modified nodal analysis matrices for the combination of the two circuits may be constructed. A rank one update may be applied to the modified set of nodal analysis matrices to produce a reduced order model of the combined electronic circuits. In this novel manner, a reduced order model for a combination of circuits may be produced from the individual reduced order models of the individual circuits without the need to recompute the reduced order models of the original circuits, and without the need of the original parasitic network models. The resulting reduced order model may be used in a variety, ways consistent with well known uses of such matrices within the field of electronic design automation.

Embodiments of the present invention provide a method of synthesizing an electronic circuit resulting from a combination of circuits based on combining reduced order models of the individual circuit elements.

Another embodiment of the present invention provides a method of placing an electronic circuit resulting from a combination of circuits based on combining reduce order models of the individual circuit elements.

Yet another embodiment of the present invention provides a method of performing a timing analysis of an electronic circuit resulting from a combination of circuits based on combining reduce order models of the individual circuit elements.

BRIEF DESCRIPTION OF THE DRAWINGS

FIG. 2 illustrates a modified nodal analysis conductance matrix corresponding to exemplary electrical circuit and a modified nodal analysis capacitance matrix corresponding to exemplary electrical circuit.

FIG. 4 illustrates an exemplary method of constructing a modified nodal analysis matrix, according to an embodiment of the present invention.

FIG. 5 illustrates producing a reduced order model of an electronic circuit to represent the connection, or stitching together, of two exemplary circuit elements, according to an embodiment of the present invention.

DETAILED DESCRIPTION OF THE INVENTION

Figure 1:
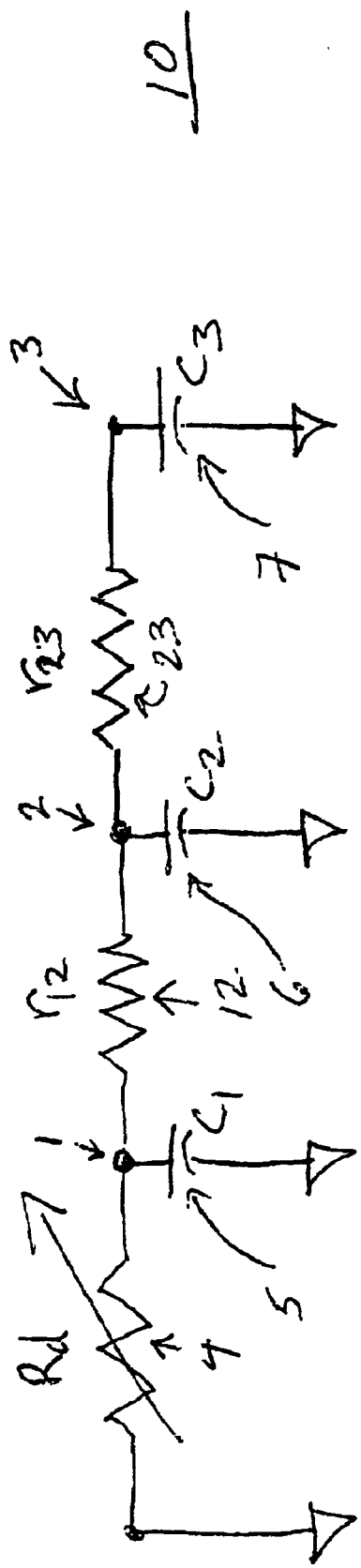
FIG. 1 illustrates a schematic of an exemplary electrical circuit.

In the following detailed description of the present invention, a methodology for stitching reduced-order models of interconnects together, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., process 100) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, It is appreciated that throughout the present invention, discussions utilizing terms such as "indexing" or "processing" or "computing" or "translating" or "calculating" or "determining" or "displaying" or "recognizing" or "generating" or "modeling" or "reducing" or "determining" or "simulating" or "synthesizing" or "constructing" or "applying" or "analyzing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

A Methodology for Stitching Reduced-order Models of Interconnects Together

Embodiments of the present invention are described in the context of the field of electronic design automation (EDA). More particularly, embodiments of the present invention relate to techniques for synthesis, simulation and analysis of integrated circuit devices. It is appreciated, however, that elements of the present invention may be utilized in the design and fabrication of other types of circuits, for example circuits comprising discrete components.

Levy, et al. ("A rank-one update method for efficient processing of interconnect parasitics in timing analysis," H. Levy, W. Scoff, D. MacMillen and J. White; Proceedings of the 37$^{th}$ ACM/IEEE Design Automation Conference, June 2000) present a technique for updating Arnoldi reduced order models, ROMs, with changes to element values in the original interconnect network. This reverence is incorporated herein as background material. "Arnoldi" describes a technique for constructing a reduced order model that is well known in the art.

Table 1 below displays pseudo code for the update technique described by Levy.

TABLE 1

```
for ( row = 1 ; row = n ; row ++) {
    for ( col = 1 ; col <= n ; col ++) {
        m [row] [col] += delta_value * u [i] [row] * u[i] [col] ;
    }
}
```

In the pseudo code of Table 1, "m" is a reduced order matrix, for example a conductance matrix "g," a capacitance matrix "c," or the capacitance-inductance matrix used in full modified nodal analysis. "Delta_value" is the change in value at node "i" in the original matrix, and "U" is the Arnoldi unitary transformation matrix. The value "N" is the size of the reduced order matrix, which is usually much less than the number of nodes in the original network. For brevity, it is convenient to use a reduced notation and represent the update of Table 1 as below in Table 2.

TABLE 2

$$m \mathrel{+}= d * u\_\{i,\}^T, u\{i,\}$$

FIG. 1 illustrates a schematic of an exemplary electrical circuit 10 which can be used to illustrate a rank one update. The circuit 10 consists of nodes 1, 2 and 3, capacitances 5, 6, and 7, labeled C1, C2 and C3 respectively, a variable drive resistance 4, labeled Rd, resistance 12, labeled R12 to represent the resistance between node1 and node 2, and resistance 23, labeled R23 to represent the resistance between node 2 and node 3.

FIG. 2 illustrates a modified nodal analysis conductance matrix 20 corresponding to exemplary electrical circuit 10 and a modified nodal analysis capacitance matrix 30 corresponding to exemplary electrical circuit 10. It is appreciated that in general other descriptions, including an inductance matrix, may be generated to describe a given electrical circuit, and that these descriptions are well suited to embodiments of the present invention.

According to well known techniques, an Arnoldi unitary transformation matrix "U" may be constructed. Given the matrices U, G and C, Arnoldi reduced order models for exemplary electrical circuit 10 may be constructed as shown below:

$$G(\text{reduced})=U^T G\ U,\ \text{and}$$

$$C(\text{reduced})=U^T C\ U.$$

A rank one update matrix "W" for node "i" may be constructed by taking the outer product of the "i-th" column of the Arnoldi unitary transformation matrix "U" with itself. Notationally, this becomes $W=Ui.Ui^T$.

To reflect a change in variable drive resistance 4, Rd, the rank one update matrix "W" may be multiplied by the scalar change in the drive resistance and added to the Arnoldi reduced order matrices to produce new reduced order matrices. For example, for a change of Rd to Rd', a new reduced order conductance matrix G(reduced)' is given by:

$$G(\text{reduced})'=G(\text{reduced})+W/(Rd'-Rd).$$

It is appreciated that the scalar factor (Rd'−Rd) is expressed in terms of conductance, and that the apostrophe symbol ("'") is used to denote "prime" or a new value.

Figure 3:
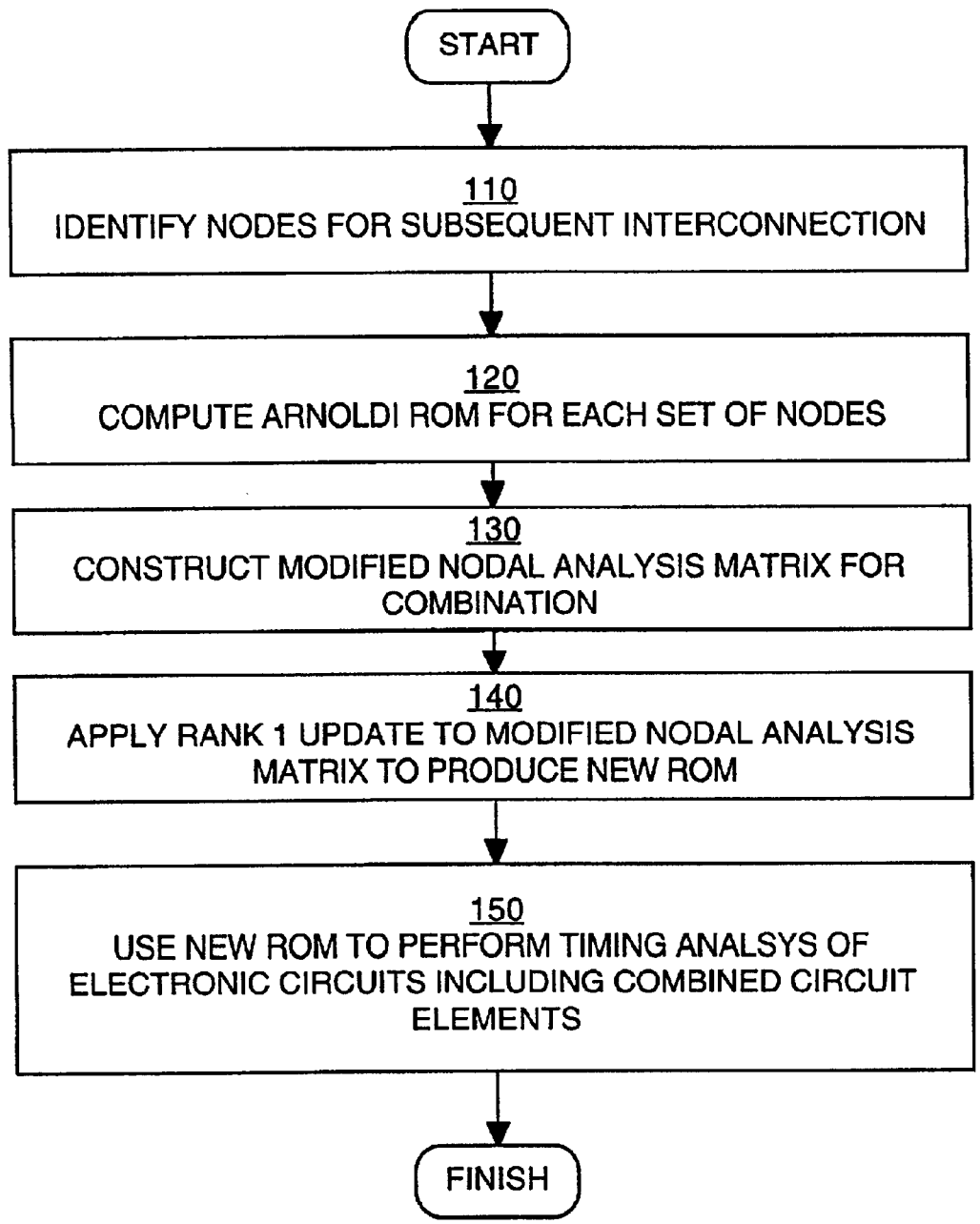
FIG. 3 depicts a flow chart of a method for producing a reduced order model of an electronic circuit to represent the connection of two or more circuit elements, according to an embodiment of the present invention.

FIG. 3 depicts a flow chart of a computer implemented method 100 for producing a reduced order model of an electronic circuit to represent the connection of two or more circuit elements, according to an embodiment of the present invention. It is appreciated that "stitching" or "stitching together" are common terms of art used by those skilled in the art to describe joining, connecting or composing circuit elements together.

Importantly, the block-Arnoldi process should be applied to every node for which rank one updates are desired to occur. A network with two drivers, for example, will require the Arnoldi process with two blocks.

In optional step 110, nodes of an electronic circuit which may be interconnected at a later point in time and nodes of that electronic circuit which may be driven may be identified. Such nodes are generally identified in well known manners by those skilled in the art, and may include, for example, input and output nodes, as well as special test nodes.

In step 120, an Arnoldi reduced order model may be computed for each set of nodes to be interconnected. The nodes to be interconnected may be identified in optional step 110, according to an embodiment of the present invention.

In step 130, a modified nodal analysis matrix for the combination of two or more circuit elements may be constructed. Item 210 of FIG. 4 illustrates an exemplary method of constructing a modified nodal analysis matrix for the combination of two reduced order matrices comprising resistors and capacitors, according to an embodiment of the present invention. It is appreciated that similar techniques may also be applied to other descriptions, alone or in combination with the above described descriptions, of a circuit, for example an inductance matrix, in accordance with embodiments of the present invention. Further, more complicated stitching may be done, for example by applying rank-1 updates to the individual g1 and g2 matrices before combining them.

With reference to FIG. 4, let g1 and g2 be the conductance matrices of the two circuits to be combined. Likewise, let c1 and c2 be the capacitance matrices of those circuits. From step 120, u1 and u2 are Arnoldi unitary transformation matrices.

Circuit 1 and circuit 2 may be combined by a wire having "g0" conductance. According to an embodiment of the present invention, the Arnoldi conductance matrix of the combination of the two exemplary circuits may be given by item 220 of FIG. 4, while item 230 gives the Arnoldi capacitance matrix of the combination and item 240 gives the Arnoldi unitary transformation matrix for the combination.

For models including inductance, the modified-nodal matrices for capacitance and inductance are combined into a single matrix so that the resulting differential equation for the system with conductance modified nodal analysis matrix G and capacitance modified nodal analysis matrix C has the form $$I=G.V+C.dV/dt.$$

With inductance, a modified nodal analysis matrix L is given by $$I=A.X+B.dX/dt$$

where I is a vector of input currents, X is a vector [V J] with voltages V and inductor currents J, and matrices A and B are defined by $$A = \begin{bmatrix} G & M \\ -M' & Z \end{bmatrix} B = \begin{bmatrix} C & Z \\ Z & L \end{bmatrix}$$

where M is the "incidence" matrix (M' is the transpose of M), and Z is a matrix of zeros. The incidence matrix is comprised of −1, 0, or 1 so that $$L.dJ/dt-(\text{Vin}-\text{Vout})=0$$

which expresses Kirchoff's current law for inductors (Vin is the voltage at the inductor terminal where J flows in, and Vout is similarly the voltage at the inductor terminal where J flows out).

When an Arnoldi reduced-order model is built for a general {G, C, L} system, the model is a set of reduced forms for the 'A' and 'B' matrices above. According to an embodiment of the present invention, a given reduced {A, B} model can be combined with other reduced {A, B} models in an analogous manner to that shown for reduced {G, C} models. The modified nodal analysis matrix and rank-1 update formulas are the same for L as C.

Referring once again to FIG. 3, in step 140 a rank one update may be applied to the modified nodal analysis matrix determined in step 130 to produce a new reduced order model for the combination of the circuits.

In optional step 150, the new ROM may be used to perform a timing analysis of an electronic circuit which comprises the combination of circuit 1 and circuit 2. It is appreciated that other well known uses of reduced order models, including simulation, synthesis, placement, routing, floor planning and further reduction are well suited to step 150 as additional embodiments of the present invention.

In this novel manner, a new reduced order model, ROM, is created for the combination of circuits, without having to recompute ROMs for each individual circuit reflecting circuit changes based on the interconnection(s) between the circuits. The new ROM may be used in simulation, timing analysis and synthesis, and may even be further reduced to lessen computational requirements.

FIG. 5 illustrates the relationships involved in producing a reduced order model of an electronic circuit to represent the connection, or stitching together, of two exemplary circuit elements, according to an embodiment of the present invention. The connection is to be made between node i of circuit 1 and node j of circuit 2, with a resistance of Rconnect.

Given reduced order conductance matrices for the two circuits G1 and G2, and reduced order capacitance matrices for the two circuits C1 and C2, Arnoldi unitary transformation matrices U1 and U2 may be computed.

According to an embodiment of the present invention, a separate U matrix may be constructed for each node to be varied, for example, a connection node or a drive node. In this example, a U matrix may be constructed for node i of circuit 1 and node j of circuit 2.

Relationship 510 of FIG. 5 describes the construction of a composition unitary transformation matrix Uc, which is formed by taking the outer product of the j-th column of U2 with the i-th row of U1.

Relationship 520 of FIG. 5 describes a modified nodal analysis construction of circuit 1 and circuit 2 with no interconnection.

Relationship 530 of FIG. 5 describes the construction of a reduced order conductance matrix for interconnected circuits 1 and 2, G12, in accordance with an embodiment of the present invention. G12 may be formed by multiplying ΔG, the change in conductance, which is a scalar equal to the inverse of the connection resistance, Rconnect, times the composition unitary transformation matrix Uc added to X. It is appreciated that similar manipulations may be applied to capacitance and/or inductance matrices as well as the Arnoldi unitary transformation matrix in accordance with embodiments of the present invention.

Element 540 of FIG. 5 shows the form of the reduced order conductance matrix G12 of the combination of circuits 1 and 2 for this example. Element 550 of FIG. 5 shows the form of the reduced order capacitance matrix C12 of the combination of circuits 1 and 2 for this example. Note that in this example the interconnect was modeled with no capacitance. Element 560 of FIG. 5 shows the form of the Arnoldi unitary transformation matrix of the combination of circuits 1 and 2 for this example.

It is to be appreciated that the new reduced order matrices and the new Arnoldi unitary transformation matrix representing the combined circuits may be used in a variety ways consistent with well known uses of such matrices within the field of electronic design automation, or EDA. For example, it is well known to use such matrices to conduct timing analysis, perform floor planning, perform placement and/or routing and synthesis using reduced order models. An advantageous benefit of embodiments of the present invention is that the new matrices may be used for such purposes without modification to the implementation of such uses. Additionally, new reduced order models produced according to embodiments of the present invention may also be further reduced in order to further reduce computational requirements for such uses.

The preferred embodiment of the present invention a methodology for stitching reduced-order models of interconnects together is thus described. While the present invention has been described in particular embodiments, it should be appreciated that the present invention should not be construed as limited by such embodiments, but rather construed according to the below claims.

What is claimed is:

1. A computer implemented method of producing a reduced order model of an electronic circuit which models a connection, said method comprising:

a) computing Arnoldi reduced order models for interconnection nodes of a plurality of circuit elements;

b) constructing a modified nodal analysis matrix for a combination of said plurality of circuit elements;

c) applying a rank one update to said modified nodal analysis matrix to produce a reduced order model of an electronic circuit to model said connection of said plurality of circuit elements; and d) storing said reduced order model in computer memory.

2. The method as described in claim 1 further comprising identifying nodes of said plurality of circuit elements for subsequent interconnection.

3. The method as described in claim 1 further comprising performing a timing analysis using said reduced order model of said electronic circuit of c).

4. The method as described in claim 1 further comprising performing a synthesis using said reduced order model of said electronic circuit of c).

5. The method as described in claim 1 further comprising performing further reduction operations on said reduced order model of said electronic circuit of c).

6. The method as described in claim 1 further comprising performing placement of circuit elements using said reduced order model of said electronic circuit of c).

7. The method as described in claim 1 further comprising performing floor planning of circuit elements using said reduced order model of said electronic circuit of c).

8. A computer usable medium having stored thereon a computer readable model of an electronic circuit, said model comprising:

an Arnoldi reduced order model of said electronic circuit; and an Arnoldi unitary transformation matrix for at least one node of said electronic circuit.

9. The computer readable medium as described in claim 8 wherein said computer readable model is used in producing a model of a combination of said electronic circuit with another electronic circuit.

10. The computer readable medium as described in claim 8 wherein said computer readable model is used in performing a timing analysis of an electronic circuit.

11. The computer readable medium as described in claim 8 wherein said computer readable model is used in performing a synthesis of an electronic circuit.

12. The computer readable medium as described in claim 8 wherein said computer readable model is further reduced.

13. The computer readable medium as described in claim 8 wherein said computer readable model is used in performing placement of said electronic circuit.

14. The computer readable medium as described in claim 8 wherein said computer readable model is used in performing floor planning of an integrated circuit.

15. A computer usable medium having computer readable code stored thereon for causing a computer system to perform a method of producing a reduced order model of an electronic circuit to model a connection of a plurality of circuits, said method comprising:
   a) computing Arnoldi reduced order models for interconnection nodes of said plurality of circuits;
   b) constructing a modified nodal analysis matrix for the combination of said plurality of circuits; and
   c) applying a rank one update to said modified nodal analysis matrix to produce a reduced order model of an electronic circuit to model said connection of said plurality of circuits.

16. The computer usable medium as described in claim 15 wherein said method further comprises identifying nodes of said plurality of circuits for subsequent interconnection.

17. The computer usable medium as described in claim 15 wherein said method further comprises performing a timing analysis using said reduced order model of said electronic circuit of c).

18. The computer usable medium as described in claim 15 wherein said method further comprises performing a synthesis using said reduced order model of said electronic circuit of c).

19. The computer usable medium as described in claim 15 wherein said method further comprises performing further reduction operations on said reduced order model of said electronic circuit of c).

20. The computer usable medium as described in claim 15 wherein said method further comprises performing placement of circuit elements using said reduced order model of said electronic circuit of c).

21. The computer usable medium as described in claim 15 wherein said method further comprises performing floor planning of circuit elements using said reduced order model of said electronic circuit of c).

* * * * *